(12) United States Patent
Ohlig

(10) Patent No.: US 6,215,548 B1
(45) Date of Patent: Apr. 10, 2001

(54) NESTED GLASS EXPOSURE TOOL REGISTRATION DEVICE

(75) Inventor: Albert H. Ohlig, Newport Beach, CA (US)

(73) Assignee: OLEC Corporation, Irvine, CA (US)

( * ) Notice: Subject to any disclaimer, the term of this patent is extended or adjusted under 35 U.S.C. 154(b) by 0 days.

(21) Appl. No.: 09/523,411

(22) Filed: Mar. 10, 2000

Related U.S. Application Data

(60) Provisional application No. 60/124,267, filed on Mar. 11, 1999.

(51) Int. Cl.$^7$ .......................... G03B 27/62; G03B 27/32; G03B 27/42; G03B 27/58; G01B 11/00
(52) U.S. Cl. .......................... 355/75; 355/26; 355/53; 355/72; 356/401; 356/399
(58) Field of Search .................. 355/26, 23, 24, 355/53, 72, 75, 99; 356/401, 399

(56) References Cited

U.S. PATENT DOCUMENTS

| | | | |
|---|---|---|---|
| 3,937,579 | * 2/1976 | Schmidt | 356/144 |
| 4,463,673 | 8/1984 | Moore . | |
| 4,764,791 | 8/1988 | Omata et al. . | |
| 4,842,412 | * 6/1989 | Miyake | 356/401 |
| 5,337,151 | * 8/1994 | Baxter et al. | 356/401 |
| 5,388,517 | 2/1995 | Levien . | |
| 5,638,156 | * 6/1997 | Dehli | 355/72 |
| 5,643,699 | 7/1997 | Waldner . | |
| 5,880,820 | * 3/1999 | Sorel et al. | 355/95 |
| 5,995,205 | * 11/1999 | Sorel et al. | 355/95 |

FOREIGN PATENT DOCUMENTS

| | | |
|---|---|---|
| 0 422 525 A2 | 10/1990 | (EP) . |
| 0 618 505 A1 | 3/1994 | (FR) . |
| 62-211657 | 9/1987 | (JP) . |

\* cited by examiner

*Primary Examiner*—Russell Adams
*Assistant Examiner*—Khaled Brown
(74) *Attorney, Agent, or Firm*—Fenwick & West, LLP

(57) ABSTRACT

Apparatus that supports and aligns a pair of glass image masters facilitates relative movements of the masters between separated positions to accommodate insertion of a circuit board, and proximate position in precision alignment of the images carried thereby on opposite sides of the circuit board. Various configurations of reference blocks and engaging followers mounted on one and the other masters assure precision alignment of the masters in proximate position, and resilient bias force exerted in relative orientation between the masters assures precision aligning engagement of followers and reference blocks. Precision positional alignment of one image master relative to the other image master is accomplished by a differential threaded assembly between relatively moveable members interposed between an image master and a follower that engages a reference block.

10 Claims, 3 Drawing Sheets

NESTED GLASS EXPOSURE TOOL REGISTRATION DEVICE

This application claims benefit of Provisional Application No. 60/124,267 filed Mar. 11, 1999.

FIELD OF THE INVENTION

This invention relates to photographic image masters and more particularly to apparatus for maintaining close-tolerance registration of such image masters on opposite sides of an image-receiving object during illumination and exposure of the image-receiving object to the image masters.

BACKGROUND OF THE INVENTION

Photographic techniques are commonly used in the fabrication of printed circuits and other chemically-milled components to form images on the surfaces of rigid or flexible substrates such as circuit boards. Certain known circuit board configurations require formation of images on opposite sides of a common circuit board in close registration at critical locations such as at through holes, apertures, peripheral borders, and the like. For such circuit board configurations, it is common to expose both light-sensitive surfaces of the circuit board through respective image masters in order to improve productivity through subsequent photographic processes that develop and etch the final circuit patterns in close registration on the opposite sides of the circuit board.

Conventional fixtures for supporting image masters commonly rely upon composite materials that are less dimensionally stable than glass-based image masters, and thus such conventional fixtures suffer loss of registration accuracy attributable to wear, thermal variations, and the like.

SUMMARY OF THE INVENTION

In accordance with one embodiment of the present invention, supporting fixtures for pairs of glass image masters rely upon the dimensional and thermal stability of glass to preserve registration accuracy over time and use. The fixtures include gas springs to counterbalance the weight of the upper glass image master and to resiliently bias the upper glass image master into proper registration with the lower glass image master. Spring actuators also bias registration of the pair of glass image masters toward one side. Reference edges of the glass image masters thus remain in dimensionally accurate registration through repeated production operations that require relative separations and closures of the pair of glass image masters as light-sensitive circuit boards are inserted, exposed to light through the image masters, and removed from the assembly for further photographic processing of the exposed images.

DETAILED DESCRIPTION OF THE INVENTION

Figure 1:
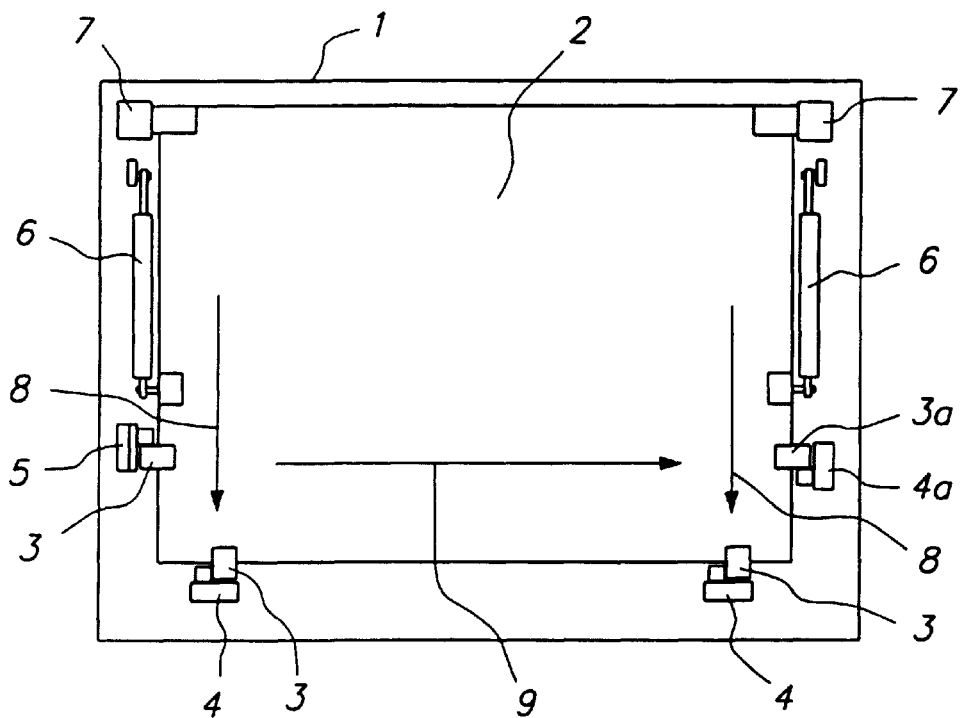
FIG. 1 is a plan view of an assembly of glass image masters according to one embodiment of the present invention.

Referring now to FIG. 1, there is shown a plan view of an assembly of upper and lower glass image masters 1,2 disposed to be selectively separated to facilitate insertion of a circuit board therebetween. The image masters 1, 2 must be realigned in substantially plane parallel orientation about opposite sides of a circuit board during the closure of the image master 1, 2 about a circuit board. The lower glass image master 1 serves as a foundation for all components, and the upper glass image master 2 is disposed to be elevated or otherwise separated from the image master 1 to accommodate placement of a circuit board between the image masters 1,2. Specifically, in the illustrated embodiment of FIG. 1, hinges 7, as more fully described later herein, are mounted on the glass image master 1 near substantially opposite corners of the upper glass image master 2. A small amount of 'play' between moving components of each hinge 7 is introduced to facilitate relative movement of the image masters 1,2 with respect to other registration-controlling components mounted on the lower glass image master 1. Specifically, conventional gas-filled composite spring and damper elements 6 are mounted to the lower glass image master 1 and to the upper glass image master 2 to support the upper master 2 in an open or elevated position and to inhibit violent closure toward registered alignment with the lower master 2. In addition, such gas springs 6 provide a resilient bias force substantially in the plane of the master 2 and toward forward or front reference blocks 4 that are also mounted on the lower master 1. A rotatable follower 3 such as the outer race of a ball bearing component, or the like, is attached to the forward or front edge of the upper master 2 to engage the reference block 4, as described later herein. Registration of the upper and lower image masters 1,2 along such fore-aft coordinate 8 is thus determined, not by the hinges 7, but by the reference blocks 4 and followers 3 under the resilient bias force provided by gas springs 6 while the upper master 2 is in the closed or aligned operational position.

In addition, a similar reference block 4a and follower 3a are mounted, respectively, on the lower image master 1, and on one side edge of the upper master 2 near the forward edge thereof. Force block 5, according to an embodiment as shown in FIGS. 4–8, and an associated follower 3 are mounted, respectively, on the lower image master 1, and on an opposite side edge of the upper image master 2 near the forward edge thereof in substantial alignment with the reference block 4a and follower 3a on the one side thereof. The force block 5 exerts a resilient bias force upon the upper image master 2, as described later herein, along a side-side coordinate 9 to force follower 3a into engagement with reference block 4a. In this way, registration of the upper and lower image masters 1,2 along such side-side coordinate 9 is thus determined, not by the hinges 7, but by the reference block 4a and follower 3a under the resilient bias force provided by force block 5 and associated follower 3 while the upper master 2 is in the closed or aligned operational position.

Figure 2:
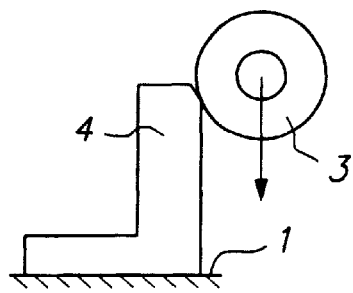
FIG. 2 is a side view of a follower engaging a reference block in the assembly of FIG. 1.
Figure 3:
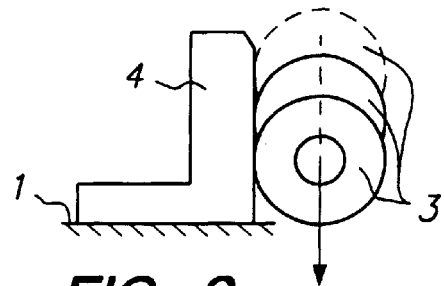
FIG. 3 is a side view of the follower traveling along the reference block in the embodiment of FIG. 2.

Referring now to the side views of FIGS. 2 and 3, there are shown reference block 4 and follower 3 in the assembly of FIG. 1. The reference block 4 is shown attached to lower glass image master 1 and the rotatable follower 3 is shown attached to an edge of upper glass image master 2. The hinges 7 allow sufficient 'play' in the position of the upper master 2 to enable follower 3 attached to the upper master 2 to overlap the vertical reference surface of block 4, typically by about 100–300 microns. A chamfer at the top of the vertical reference edge of block 4 and 4a promotes significant leverage against the resilient bias force exerted fore and aft by the gas springs 6 (or side to side by the force block 5) to provide tactile feedback that assures the operator of proper registration upon closure of the upper master 2 into operational position on the lower master 1.

Figure 4:
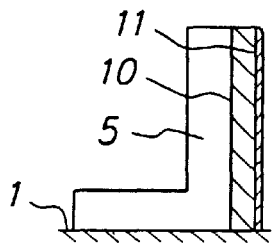
FIG. 4 is a side view of a force block in the assembly of FIG. 1 including a resilient layer intermediate the surface layer and block.
Figure 5:
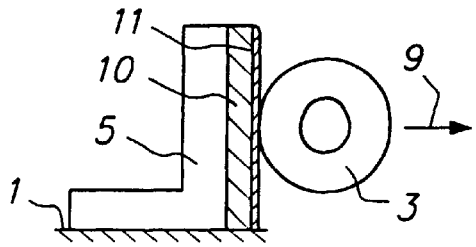
FIG. 5 is a side view of a follower engaged with the force block of FIG. 4 to produce a resilient lateral force.

Referring now to FIGS. 4 and 5, there are shown side views of one embodiment of force block 5 that includes a layer of resilient elastomeric material 11 interposed between the block 5 and an outer metallic layer 10. As shown in FIG. 5, a follower 3 attached to a side edge of the upper master 2 overlaps the vertical face of the metallic layer 10, typically by about 100–300 microns. A chamfer at the top of the vertical face of layer 10 promotes significant leverage against the resilient bias force exerted side to side by the resilient layer 11. This provides tactile feedback to an operator of the distinctive override and proper positioning of the upper master 2 in closed position upon the lower master 1.

Figure 6:
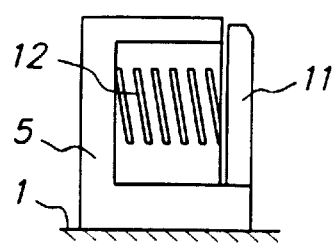
FIG. 6 is a side view of another embodiment of a force block using a resilient biasing spring.
Figure 7:
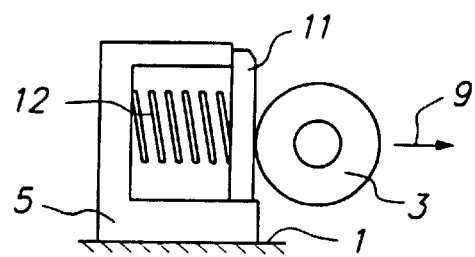
FIG. 7 is a side view of the force block of FIG. 6 engaged with a follower to produce a lateral force.
Figure 8:
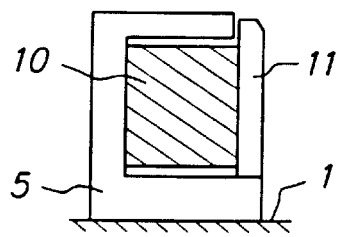
FIG. 8 is a side view of another embodiment of a force block including a resilient elastomeric spring to produce lateral force against a follower in engagement therewith.

Referring now to FIGS. 6, 7 and 8, there are shown side views of other embodiments of force block 5 for exerting side to side lateral force upon the upper master 2 against the reference block 4a. Specifically, a spring 12 or a resilient elastomeric component 10 may be disposed within the force block to exert resilient bias force against a metallic outer layer 11 and a follower 3 engaged therewith. Various spring constants or compliance parameters may be selected for spring 12 or elastomeric component 10 to provide adequate lateral force on upper master 2 in the direction along axis 9 to assure accurate positioning against reference block 4, and typically to provide such force in the range from about 5 kg to about 20 kg. Similar range of force in the fore-to-aft direction along axes 8 may be provided by each of the gas springs 6.

Figure 9:
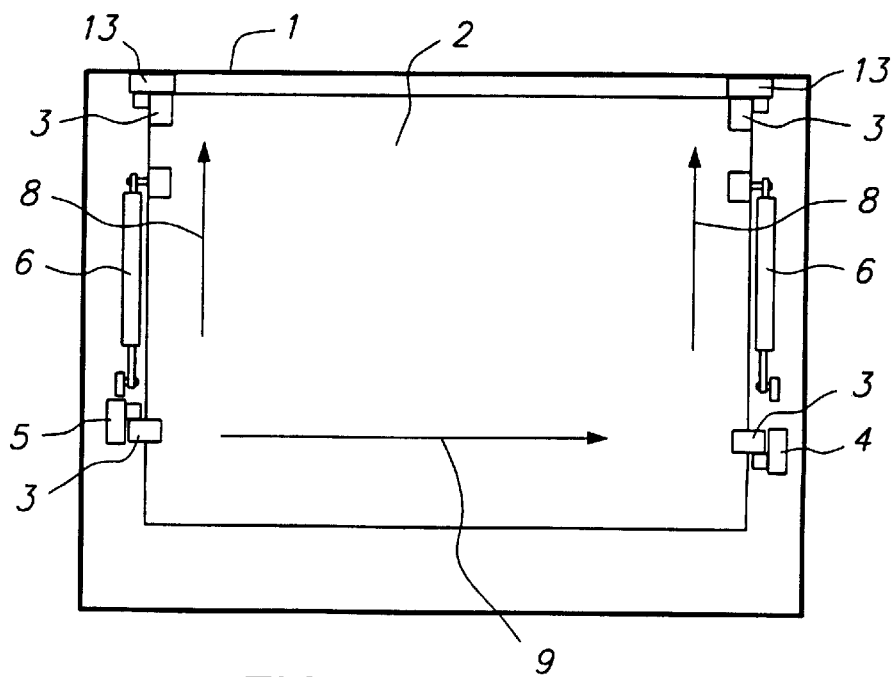
FIG. 9 is a plan view of an assembly according to another embodiment of the present invention in which the reference points for gas springs are reversed.
Figure 10:
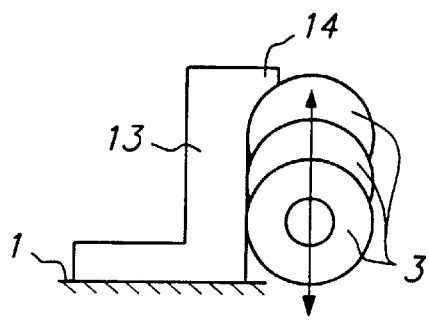
FIG. 10 is a side view of a hinge block in which a follower permits a range of vertical elevational adjustments to a stop position.

Referring now to the plan view of FIG. 9, there is shown an alternative embodiment of the registration device of the present invention in which the gas springs 6 are mounted between lower and upper image masters 1,2 to exert resilient positioning force in the opposite fore-and-aft direction 8, against hinge blocks 13 that may also serve as reference blocks. Specifically, as shown in the side view of FIG. 10, there is shown a hinge block 13 similar to reference block 4, 4a attached to the lower image master 1, but with a cornice or overhang 14 protruding from the upper region of the reference surface against which follower 3 presses. In this embodiment, the follower 3 attached to the upper image master 2 is free to elevate vertically over a limited range to accommodate thickness variations of a circuit board interposed between the lower and upper image masters 1,2. However, the upper image master 2 is inhibited from exceeding the vertical position beyond contact of the follower 3 with the cornice 14 in the upper region of the vertical reference without operator exertion of substantial overriding force against the resilient bias of gas springs 6.

Figure 11:
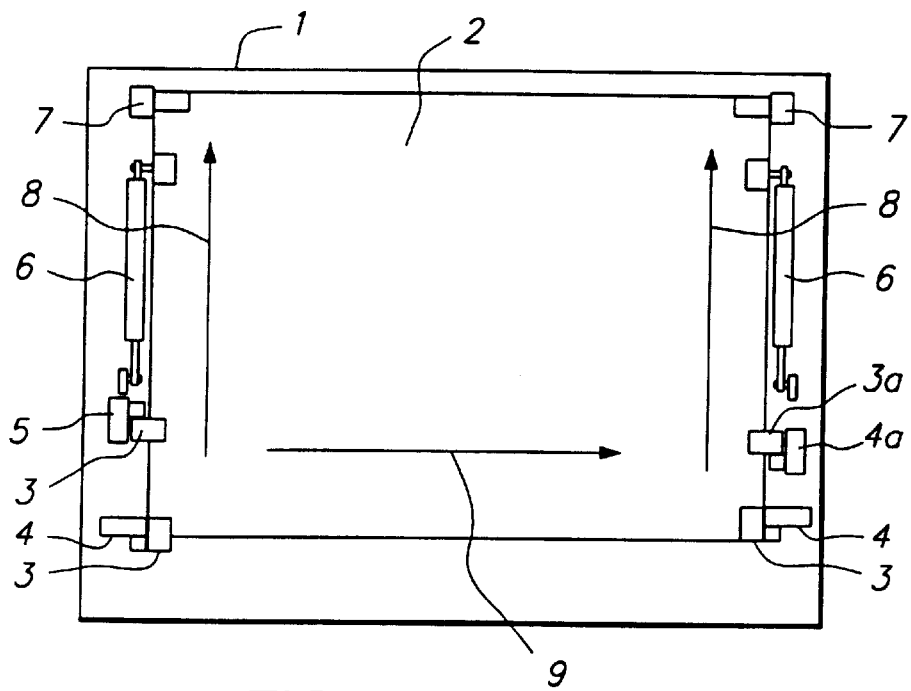
FIG. 11 is a plan view of an assembly according to another embodiment of the present invention with the gas springs in alternate position.

Referring now to FIG. 11, there is shown a plan view of another embodiment of the present invention in which the reference blocks 4 and associated followers 3 may be positioned near forward regions of the side edges of the upper image master 2 to provide precision positioning thereof by pulling rather than pushing the follower 3 against the vertical reference surface of the reference block 4. Conventional adjustment mechanisms may be provided on reference blocks 4, 4a and followers 3,3a in all embodiments to facilitate alignment of images on the upper and lower image masters while in proximate relative positions. The resilient forces along axes 8, 9 may be oriented substantially within the plane of the upper image master 2, or in the alternative, in a direction slightly downward toward a reference block to provide a small amount of toggle and tactile feedback.

Figure 12:
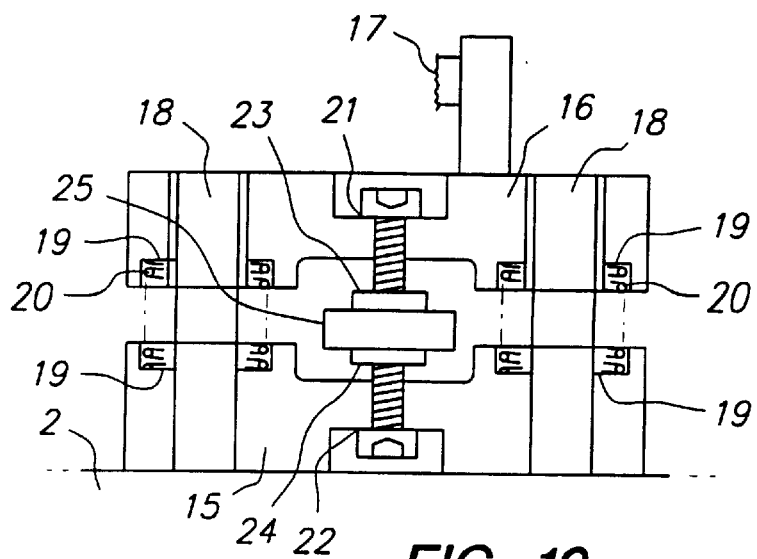
FIG. 12 is an exploded view of an adjustable hinge on force block.

Referring now to FIG. 12, there is shown an exploded top view of an adjustable hinge block or force block according to one embodiment to provide minute adjustments of positional orientation of the upper master 2 relative to the lower master 1. Specifically, a hinge 7 or a force block may include two separable members 15, 16 for attachment to the upper master 2 and to a hinge block 7 or roller via pivot axle 17. The members 15, 16 are supported for relative sliding movement on pins 18 that may be fixed to one member 15 (as by press fit, set screw, threaded attachment or the like) and are slidable in the other member 16, substantially in the plane of a master 1, 2. A recess 19 in one or both of the members 15, 16 about the pins 18 houses a coil spring 20 that resiliently pre-loads the relatively slidable members apart.

The relative slide position of the members 15, 16 is determined by the central mechanism including a pair of threaded bolts or members 21, 22 of dissimilar pitch or thread count, and the associated mating threaded nuts 23, 24. The threaded nuts 23, 24 are attached via central adjustment wheel 25 to rotate together on the respective bolts 21, 22. The bolts 21, 22 may be threadedly attached to the respective members 16, 15 to provide course adjustment of the relative slide positions of the member 15, 16. Fine positioning of the members 15, 16 is accomplished by rotating the central wheel 25 in one or other rotational directions. Because of the dissimilar thread pitch or thread count of the members 21, 22 (e.g., 8–32; 4–40), differential rates of advance and retreat of a nut 23, 24 upon the respective threaded member 21, 22 provide differential jack screw motion (e.g., 160 turns of wheel 25 per inch of movement) of members 15, 16. In this way, very fine adjustments of registration of the upper and lower masters 1, 2 that are attached to the members 15, 16 may be accomplished.

Therefore, the present invention provides repeatable, precision positioning of a pair of glass image masters that are disposed to separate and receive a circuit board therebetween, and that can then be accurately re-aligned on opposite sides of such circuit board for photographic exposure processing of the master images onto the opposite sides of the circuit board.

I claim:
1. In combination:
   a first substantially planar image-carrying master having peripheral edges;

a second substantially planar image-carrying master having peripheral edges and being disposed to move relative to the first master between proximate and separated positions;

at least one reference block disposed at a selected location near a peripheral edge of one of the masters, and being attached thereto with a reference surface thereof vertically oriented relative to the attached master;

a follower disposed near a corresponding peripheral edge of the other of the master, and being attached thereto at a location to engage the corresponding reference surface of at least one reference block to establish aligned relative positioning of the masters in the proximate position; and a resilient element positioned between the masters to exert resilient biasing force of the follower attached to said other master against the vertical surface of the corresponding reference block attached to said one master.

2. The combination of claim 1 comprising:

another reference block disposed at a spaced location from the one reference block near a peripheral edge of the one master, and being attached thereto with a reference surface thereof vertically oriented relative to the attached master; and another follower disposed near a peripheral edge of the other master and being attached thereto at a location to engage the corresponding reference surface of said another reference block to establish aligned relative positioning of the masters in the proximate position thereof.

3. The combination of claim 2 comprising:

another resilient element positioned between the masters to exert resilient biasing force of said another follower attached to said other master against the vertical surface of the corresponding said another reference block attached to said one master.

4. The combination of claim 3 in which the reference blocks are disposed along a common peripheral edge of the one master and the followers are disposed along a corresponding common peripheral edge of the other master; and said resilient elements are disposed to exert said resilient biasing forces in substantial alignment substantially within a plane parallel to a plane of a master.

5. The combination of claim 3 in which the reference blocks are disposed along orthogonally-oriented peripheral edges of one of the masters; and the followers are disposed along corresponding orthogonally-oriented peripheral edges; and said resilient elements are disposed to exert resilient bias forces in substantially orthogonal orientations within a plane substantially parallel to a plane of a master.

6. The combination of claim 4 in which the reference blocks include protrusions near upper regions of the vertical reference surfaces thereof oriented in a direction against said resilient bias forces to provide stop positions for inhibiting movement thereat of the corresponding followers.

7. The combination of claim 2 in which the followers engaging corresponding reference surfaces are rotationally mounted on the other master.

8. The combination of claim 7 in which the rotational axes of the followers are substantially aligned within a common plane.

9. The combination of claim 7 in which the rotational axes of the followers are substantially orthogonally aligned within a common plane.

10. The combination of claim 1 including a pair of support members interposed between one master and a follower for relative movement therebetween substantially within the plane of the one master; and a differential threaded assembly coupling the support members for altering the relative positions thereof in response to rotation of the differential thread assembly.

* * * * *